(12) United States Patent
Arai et al.

(10) Patent No.: US 8,392,050 B2
(45) Date of Patent: Mar. 5, 2013

(54) VEHICLE LOAD CONTROL DEVICE

(75) Inventors: Takashi Arai, Utsunomiya (JP); Kenichi Ishida, Sakura (JP)

(73) Assignee: Honda Motor Co., Ltd., Tokyo (JP)

( * ) Notice: Subject to any disclaimer, the term of this patent is extended or adjusted under 35 U.S.C. 154(b) by 676 days.

(21) Appl. No.: 12/586,433

(22) Filed: Sep. 22, 2009

(65) Prior Publication Data

US 2010/0082198 A1 Apr. 1, 2010

(30) Foreign Application Priority Data

Sep. 26, 2008 (JP) ................................. 2008-247051

(51) Int. Cl.
*G01M 17/00* (2006.01)
(52) U.S. Cl. .................................. 701/29.1; 340/636.15
(58) Field of Classification Search .................. 701/29.1; 340/636.15, 636.16; 307/10.7, 66; 320/136; 327/544, 427, 387
See application file for complete search history.

(56) References Cited

U.S. PATENT DOCUMENTS 6,806,588 B2 * 10/2004 Amano et al. ............... 307/10.7

FOREIGN PATENT DOCUMENTS

| JP | 2001-061117 A | 3/2001 |
|----|---------------|--------|
| JP | 2003-063330   | 3/2003 |
| JP | 2006-296085 A | 10/2006 |
| JP | 2007-230398 A | 9/2007 |

* cited by examiner

*Primary Examiner* — Thomas Black
*Assistant Examiner* — Luke Huynh
(74) *Attorney, Agent, or Firm* — Carrier Blackman & Associates, P.C.; William D. Blackman; Joseph P. Carrier (57) ABSTRACT

A vehicle load control device comprises a battery that supplies power to an electrical load of the vehicle; a battery sensor that detects a consumption state of the battery; and a control unit that cuts off power supply to the electrical load when the consumption state of the battery reaches a predetermined state. The control unit detects a consumption state of the battery at a relatively short first time interval, in a case where a consumption amount of the battery after the engine stops is greater than or equal to a predetermined value, and detects a consumption state of the battery at a relatively long second time interval, in a case where the consumption amount of the battery after the engine stops is less than a predetermined value, and cuts off power supply to the electrical load depending on the consumption state of the battery detected by the battery sensor.

17 Claims, 6 Drawing Sheets

VEHICLE LOAD CONTROL DEVICE

BACKGROUND OF THE INVENTION

1. Field of the Invention

The present invention relates to a vehicle load control device.

The present invention claims priority on Japanese Patent Application No. 2008-247051, filed on Sep. 26, 2008, the contents of which are incorporated herein by reference.

2. Description of Related Art

Heretofore, a control device is known in which, for example, after every time that a vehicle is parked the state of the power consumption of its battery is detected, and based on the detection result, the power source is cut off before a preset power source cut off period (for example, Japanese Unexamined Patent Application, First Publication No. 2003-63330).

Incidentally, in a control device according to an example of the above-described conventional technique, the state of the power consumption of the battery is detected routinely regardless of, for example, the state of the power consumption of the battery, or the usage state of the electrical load, and the like. Thereby the power consumption of the detection operation itself is increased. Therefore, there is concern about the state of the battery deteriorating.

SUMMARY OF THE INVENTION

The present invention has an object of providing a vehicle load control device that can control the power supply to an electrical load appropriately while preventing the power consumptions from increasing excessively.

A vehicle load control device according to an aspect of the present invention comprises a battery that supplies power (electrical power) to an electrical load of the vehicle; a battery sensor that detects a consumption state of the battery; and a control unit that cuts off the power supply to the electrical load when the consumption state of the battery reaches a predetermined state, wherein the control unit performs a first control for detecting a consumption state of the battery at a relatively short first time interval, in a case where a consumption amount of the battery after an engine stops is greater than or equal to a predetermined value, performs a second control for detecting a consumption state of the battery at a relatively long second time interval, in a case where the consumption amount of the battery after the engine stops is less than a predetermined value, and cuts off the power supply to the electrical load depending on the consumption state of the battery detected by the battery sensor.

Furthermore, in the vehicle load control device according to another aspect of the present invention, the electrical load comprises a first electrical load to which power supply and cut off under the control of an operator are possible, and a second electrical load to which power supply and cut off under the control of the operator are impossible, and the control unit cuts off the power supply to the first electrical load in the first control, and cuts off the power supply to the second electrical load in the second control.

Moreover, in the vehicle load control device according to another aspect of the present invention, the vehicle load control device further comprises a timer for measuring duration of the first control, and the control unit cuts off the power supply to the first electrical load when the measured duration of the timer reaches a predetermined time.

Furthermore, in the vehicle load control device according to another aspect of the present invention, the control unit performs the second control after the power supply to the first electrical load is cut off by the first control, and cuts off the power supply to the second electrical load in a case where the consumption amount of the battery is greater than or equal to a predetermined value.

Moreover, a vehicle load control device according to another aspect of the present invention comprises a battery that supplies power to an electrical load of the vehicle; a battery sensor that detects a consumption state of the battery after an engine stops; and a control unit that cuts off power supply to the electrical load when the consumption state of the battery reaches a predetermined state, wherein the control unit sets a time interval to a next detection of the battery sensor depending on the consumption state of the battery when detection of the consumption state of the battery is executed by the battery sensor.

According to the vehicle load control device of the present invention, since the time interval for detecting the consumption state of the battery is changed depending on the consumption amount (consumption level) of the battery when the ignition switch is off, it is possible to detect the consumption state of the battery while ensuring the desired detection accuracy with the necessary minimum detection interval, which is depending on the state of the working conditions of the electrical load when the ignition switch is off. So that it is possible to prevent the power consumption of the detection operation itself from increasing.

Furthermore, according to the vehicle load control device of the present invention, in the case where the consumption amount of the battery after the ignition switch is turned off is greater than or equal to a predetermined value, it is determined that there is a high probability that the operator has forgotten to turn off the power supply to the first electrical load, so the power supply to the first electrical load is cut off by the first control. In this manner, there is a high probability that the consumption amount of the battery can be improved with no need for direct detection of the electrical load in operation state, so that it is possible to reduce the consumption amount of the battery efficiently while preventing the cost from increasing.

Moreover, according to the vehicle load control device of the present invention, by cutting off the power supply to the first electrical load in response to the duration of the first control, it is possible to prevent power from being consumed unnecessarily in a state in which there is a high probability that the operator has forgotten to turn off the power supply to the first electrical load. As a result, compared with the case where the power supply to the electrical load is cut off routinely depending only on the consumption state of the battery, for example, it is possible to prevent the battery from deteriorating even more.

Furthermore, according to the vehicle load control device of the present invention, in the case where the consumption amount of the battery is less than or equal to a predetermined value, and is improved by the first control, by performing the second control it is possible to determine whether or not to continue to supply power to the electrical load that requires power consumption which is a relatively low consumption amount. As a result, detailed controls are possible, such as cutting off the power supply to an electrical load such as an interior light that is lighting-up because the operator forgot to turn it off for example, maintaining the power supply to the electrical load of a backup system, or the like, so that it is possible to improve the convenience while controlling the increase in the power consumption of the battery.

Moreover, in the case where the consumption amount of the battery does not drop to a predetermined value or below, and is not improved even if the first control is performed, it is determined that there is a high probability that the second electrical load is in an abnormal state, so it is possible to prevent unnecessary power consumption by cutting off the power supply to the second electrical load.

Furthermore, according to the vehicle load control device of the present invention, it is possible to detect the consumption state of the battery at appropriate time intervals as required depending on the consumption state of the battery, so that it is possible to prevent excess power from being consumed in order to detect the consumption state of the battery.

DETAILED DESCRIPTION OF THE INVENTION

Hereunder are a description of a vehicle load control device and a display control method of a vehicle according to an embodiment of the present invention, with reference to the appended drawings.

Figure 1:
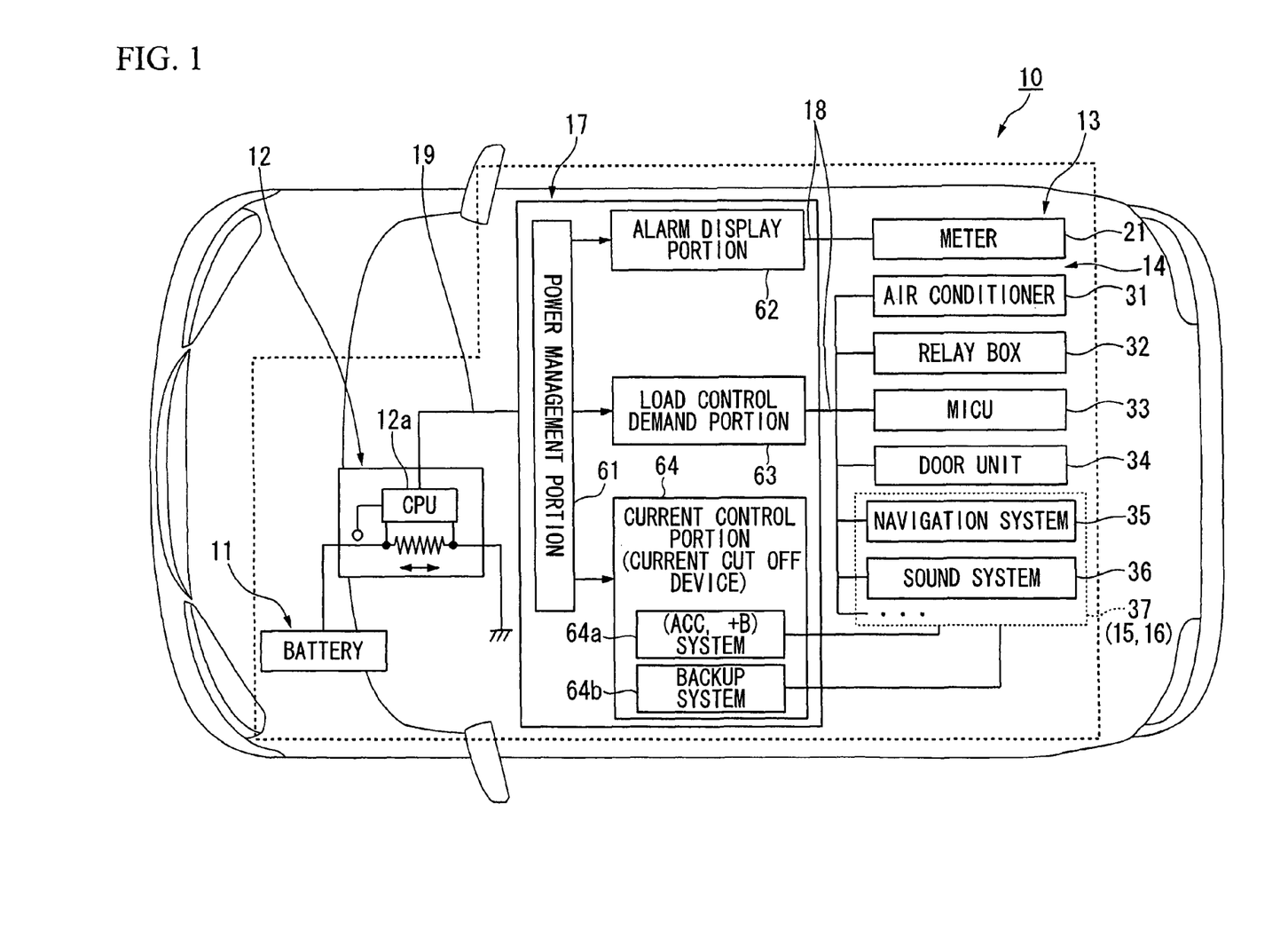
FIG. 1 is a configuration view of a vehicle load control device according to an embodiment of the present invention.

As shown in FIG. 1, for example, a vehicle load control device 10 according to the present embodiment includes a battery 11, a battery sensor 12, an alarm display device 13, an ignition system (IG system) electrical load 14, a first electrical load 15, a second electrical load 16, and a power management unit 17.

The battery 11 is a 12 volt battery consisting of a lead battery, for example.

The battery sensor 12 includes sensors for detects each of current, voltage, and temperature of the battery 11, and a CPU (central processing unit) 12a for performing a range of calculation processing such as calculating the battery residual capacity (for example state of charge SOC which is a parameter of the state of charge of the battery 11). The battery sensor 12 detects the battery current IB, the battery voltage VB, and the state of charge SOC, for example, as consumption states of the battery 11, and outputs the signals of the detection results.

The alarm display device 13 includes a meter (indicator) 21, a speaker (not shown), a display unit (not shown), and the like, for example. The alarm display device 13 is connected with the power management unit 17 by a CAN (Controller Area Network) communication line 18 (for example B (Body)-CAN whose communication speed is relatively slow compared with F (Fast)-CAN) of the vehicle. As a result, the alarm display device 13 receives a control instruction output from the power management unit 17 via the CAN communication line 18, and outputs or display an alarm depending on the received control instruction.

The ignition system electrical load 14 is an electrical load in which the operating conditions are controlled when an ignition switch (not shown) is on. The ignition system electrical load 14 includes electrical loads such as an air conditioner 31, a relay box 32, a MICU (Multiplex Integrated Control Unit) 33, a door unit 34, a navigation system 35, a sound system 36, and the like. Each of the electrical loads is connected with the power management unit 17 by the CAN communication line 18 (for example B-CAN) of the vehicle, for example.

Each of the electrical loads connected with the power management unit 17 by the CAN communication line 18 of the vehicle receives control instructions output from the power management unit 17 via the CAN communication line 18, and performs operations according to the received control instructions.

Among the electrical loads connected with the CAN communication line 18, the navigation system 35 and the sound system 36, for example, form a multiple power supply electrical load 37 that receives power supply from both systems of an (ACC, +B) system and a backup system.

The multiple power supply electrical load 37 includes a first electrical load 15, which receives the power supply from the (ACC, +B) system, and a second electrical load 16, which receives the power supply from the backup system.

The first electrical load 15 is an electrical load to which the power supply and cut off under the control of an operator are possible, such as all of the lamps (not shown) and the like. The first electrical load 15 is connected with the positive terminal of the battery 11 via the power management unit 17, and the power supply and power cut off to the first electrical load 15 are controlled by current cut off devices such as latch relays (not shown) in the power management unit 17, for example. The power supply and power cut off of the first electrical load 15 can be switched under the control (for example, input operations to the ignition switch and a range of switches, and the like) of the operator. For example, in a state where the ignition switch is off, the power is cut off, and in a state where the ignition switch is at ACC state, the power is supplied.

The second electrical load 16 is an electrical load to which power supply and cut off under the control (for example, input operations to the ignition switch and the like) of an operator are prohibited, such as a memory device (not shown), for example, to which constant power supply is desirable. The power supply to the second electrical load 16 is maintained by the battery 11 regardless of the control (for example, turning the ignition switch off, or input operations to a range of switches) of the operator.

The second electrical load 16 is connected with the positive terminal of the battery 11 via the power management unit 17, and it is possible to supply and cut off the power using current cut off devices such as latch relays (not shown) in the power management unit 17, for example.

The power management unit 17 includes, for example, a power management portion 61, an alarm display portion 62, a load control demand portion 63, and a current control portion 64.

The power management portion 61 is connected with the battery sensor 12 by a LIN (Local Interconnect Network) communication line (LIN) 19 of the vehicle, for example. In the LIN communication line 19, signals (for example battery current IB, battery voltage VB, state of charge SOC, and the like) of detection results according to the state of charge and the state of deterioration of the battery 11 are transmitted from the battery sensor 12, in response to demand instructions output from the power management portion 61. In this case, the power management portion 61 is a master unit (master shown in FIG. 3) and the battery sensor 12 is a slave unit (slave shown in FIG. 3).

The power management portion 61 performs a range of determination processing, to be described later, based on the signals received from the battery sensor 12, and outputs control instructions to the alarm display portion 62, the load control demand portion 63, and the current control portion 64 in response to the determination results of the determination processing.

The detection operation by the battery sensor 12, being a slave unit, is set such that it is performed at a predetermined cycle period (for example, one minute or the like) regardless of the transmission timing of the detection result signals.

The alarm display portion 62 controls the operation of the alarm display device 13, for example by displaying on the meter (indicator) 21 or outputting a sound from a speaker (not shown), in response to the control instruction output from the power management portion 61.

The load control demand portion 63 controls the operation of the ignition system electrical load 14 according to control instructions output from the power management portion 61. For example, the load control demand portion 63 controls the operations depending on the power consumption of each of the electrical loads and their degree of importance in a state in which the power required for a desired running state and restarting are ensured.

The current control portion 64 includes an (ACC, +B) system control portion 64a and a backup system control portion 64b. The (ACC, +B) system control portion 64a controls the power supply and power cut off with respect to the first electrical load 15, and the backup system control portion 64b controls the power supply and power cut off with respect to the second electrical load 16, according to control instructions output from the power management portion 61.

The vehicle load control device 10 according to the present embodiment has the above-described construction. Next is a description of the operation of the vehicle load control device 10, in particular the processing in the power management unit 17 for determining power supply and power cut off with respect to the first electrical load 15 and the second electrical load 16, with reference to the appended drawings.

Figure 2:
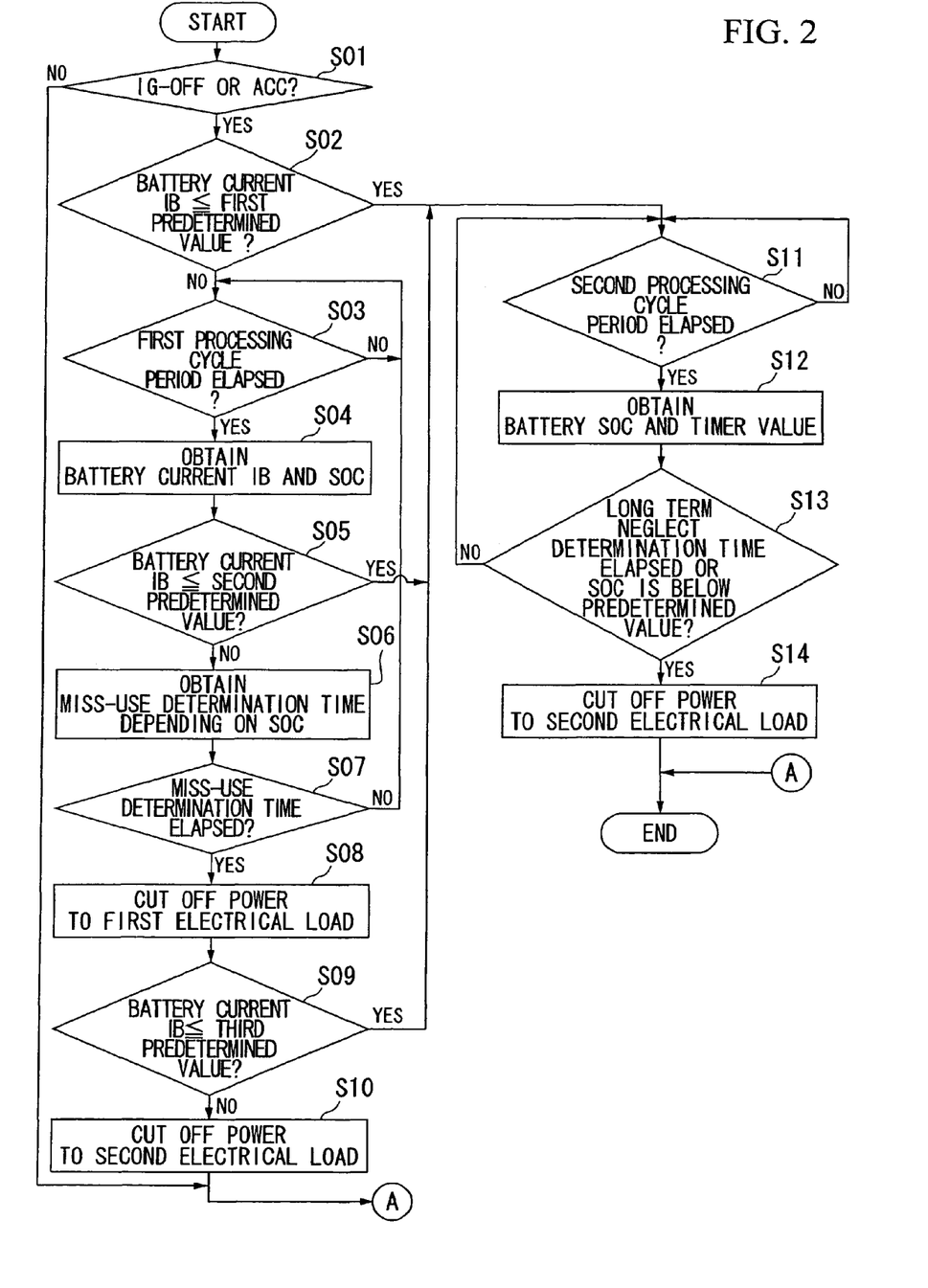
FIG. 2 is a flow chart showing the operation of the vehicle load control device according to the embodiment of the present invention.

Firstly, in step S01 shown in FIG. 2, it is determined whether or not the ignition switch is off (IG-OFF) or the ignition switch is set to the ACC position.

In the case where the determination result is "NO", the flow proceeds to the end, and the processing does not advance.

On the other hand, in the case where the determination result is "YES", the flow proceeds to step S02.

Then, in step S02, it is determined whether or not the consumption amount of the battery 11 obtained from the battery sensor 12, for example the battery current IB, is less than or equal to a first predetermined value.

In the case where the determination result is "YES", the processes from step S03 to step S10 as shown in the following are skipped, and the flow proceeds to step S11.

On the other hand, in the case where the determination result is "NO", the flow proceeds to step S03.

The first predetermined value for the battery current IB may be a fixed value unrelated to the duration after the ignition switch is turned off (IG-OFF) or the ignition switch is set to the ACC position, for example, or may be a variable value that reflects the fact that the current supplied to a range of electrical loads varies according to the duration after the ignition switch is turned off (IG-OFF) or the ignition switch is set to the ACC position, for example.

In step S03, it is determined whether or not a predetermined first processing cycle period (for example five minutes or the like) has elapsed after the ignition switch was turned off (IG-OFF) or the ignition switch was set to the ACC position, or after the previous first processing cycle period elapsed.

In the case where the determination result is "NO", the determination processing of step S03 is repeated.

On the other hand, in the case where the determination result is "YES", the flow proceeds to step S04.

In step S04, the battery current IB and the consumption state (for example, the state of charge SOC, or the like) are obtained from the battery sensor 12.

In step S04, in the case where the detection value of the battery current IB is obtained from the battery sensor 12, the CAN communication line 18 is placed in a stopped state for a predetermined processing period (for example five seconds or the like), and only the LIN communication line 19 is placed in an active state. As a result, the power consumption (for example, the power consumed during the period from when the ignition system electrical load 14 connected to the CAN communication line 18 is started until each of the electrical loads is shifted to a dormant state at individual timing) accompanying the placement of the CAN communication line 18 in an active state is reduced, thus improving the detection accuracy of the battery current IB of the battery 11.

In step S05, it is determined whether or not the consumption amount of the battery 11 obtained from the battery sensor 12, for example the battery current IB, is less than or equal to a second predetermined value.

In the case where the determination result is "YES", the processes from step S06 to step S10 as shown in the following are skipped, and the flow proceeds to step S11.

On the other hand, in the case where the determination result is "NO", the flow proceeds to step S06.

The second predetermined value for the battery current IB may be a fixed value unrelated to the duration after the ignition switch is turned off (IG-OFF) or the ignition switch is set to the ACC position, for example, or may be a variable value that reflects the fact that the current supplied to a range of electrical loads varies according to the duration after the ignition switch is turned off (IG-OFF) or the ignition switch is set to the ACC position, for example.

In step S06, the LIN communication line 19 is placed in a stopped state for a predetermined processing period (for example five seconds or the like), only the CAN communication line 18 is placed in an active state, and information about the operation conditions, information about the switching status indicating running state or stopped state, and the like are obtained for every electrical/load of the first electrical load 15 from a MICU (Multiplex Integrated Control Unit) 33 connected to the CAN communication line 18, for example. Then, a Miss-use determination time is obtained by using map retrieval from a predetermined map set in advance, and the Miss-use determination time set at this point of time is updated using the obtained Miss-use determination time.

The predetermined map is a map indicating the correspondence relationship between the state of charge SOC of the battery 11 and the Miss-use determination time, and it is set such that the greater the state of charge SOC, the longer the corresponding Miss-use determination time. For example, when the state of charge SOC is less than a predetermined low side threshold SOC-L, the Miss-use determination time is set to a first duration (for example fifteen minutes or the like), when the state of charge SOC is greater than or equal to a predetermined low side threshold SOC-L and less than a predetermined high side threshold SOC-H, the Miss-use determination time is set to a second duration (for example twenty minutes or the like), and when the state of charge SOC is greater than or equal to a predetermined high side threshold SOC-H, the Miss-use determination time is set to a third duration (for example twenty-five minutes or the like). In this case, the Miss-use indicates that the power is consumed by the operation mistake, for example the operator has forgotten to turn off the power supply to the interior lamp, or the like (e.g., undue power consumption). The Miss-use determination time is a predetermined time which indicates the amount of time allowed for power to be supplied to the electrical load such as the interior lamp after the ignition switch is turned off (IG-OFF) or the ignition switch is set to the ACC position.

Furthermore, immediately after the ignition switch is turned off (IG-OFF) or the ignition switch is set to the ACC position, a predetermined initial value is set as a Miss-use determination time.

When the execution of the process of step S06 is completed, the state in which the LIN communication line 19 is stopped is maintained, and also the CAN communication line 18 that was placed in an active state is stopped.

In step S07, it is determined whether or not the duration after the ignition switch was turned off (IG-OFF) or the ignition switch was set to the ACC position, has reached the Miss-use determination time currently set.

In the case where the determination result is "NO", the flow returns to the abovementioned step S03.

On the other hand, in the case where the determination result is "YES", the flow proceeds to step S08.

In step S08, the power to the first electrical load 15 is cut off, and a notification operation (for example a message display, lighting of an indicator lamp, sound output, or the like) notifying the fact that the power was cut off is set to execute at the next time that the ignition switch is turned on (IG-ON). When the power of the first electrical load 15 is cut off, a preliminary notification operation (for example a message display, lighting of an indicator lamp, sound output, or the like) is performed prior to the power being cut off.

In step S09, it is determined whether or not the consumption amount of the battery 11 obtained from the battery sensor 12, for example the battery current IB, is less than or equal to a third predetermined value.

In the case where the determination result is "YES", the execution of the process of step S10 shown as follows is skipped, and the flow proceeds to step S11, which is described later.

On the other hand, in the case where the determination result is "NO", it is determined that an abnormality of dark current has occurred, in which the current supplied in the second electrical load 16 is excessively large, and the flow proceeds to step S10.

The third predetermined value for the battery current IB may be a fixed value unrelated to the duration after the ignition switch is turned off (IG-OFF) or the ignition switch is set to the ACC position, for example, or may be a variable value that reflects the fact that the current supplied to a range of electrical loads varies according to the duration after the ignition switch is turned off (IG-OFF) or the ignition switch is set to the ACC position, for example.

In step S10, the power to the second electrical load 16 is cut off, and a notification operation (for example a message display, lighting of an indicator lamp, sound output, or the like) notifying the fact that the power was cut off is set to execute at the next time that the ignition switch is turned on (IG-ON), the flow proceeds to the end, and the process finishes. When the power of the second electrical load 16 is cut off, a preliminary notification operation (for example a message display, lighting of an indicator lamp, sound output, or the like) is performed prior to the power being cut off.

Furthermore, in step S11, it is determined whether or not a predetermined second processing cycle period (for example two hours or the like) has elapsed after the ignition switch was turned off (IG-OFF) or the ignition switch was set to the ACC position, or after the predetermined second processing cycle period elapsed.

In the case where the determination result is "NO", the determination processing of step S11 is repeated.

On the other hand, in the case where the determination result is "YES", the flow proceeds to step S12.

In step S12, the CAN communication line 18 is placed in a stopped state for a predetermined processing period (for example five seconds or the like), and only the LIN communication line 19 is placed in an active state, the consumption state (for example the state of charge SOC and the like) of the battery 11 is obtained from the battery sensor 12, and also a timer value is obtained which indicates the elapsed duration after the ignition switch was turned off (IG-OFF) or after the ignition switch was set to the ACC position.

When the execution of the process of step S12 is completed, the state in which the CAN communication line 18 is stopped is maintained, and also the LAN communication line 19 that was placed in an active state is stopped.

In step S13, it is determined whether or not the elapsed duration after the ignition switch was turned off (IG-OFF) or the ignition switch was set to the ACC position has reached a predetermined long term neglect determination time (for example several days or the like), or whether or not the state of charge SOC of the battery 11 has dropped to a predetermined SOC or below.

In the case where the determination result is NO", the flow returns the abovementioned step S11.

On the other hand, in the case where the determination result is "YES", the flow proceeds to step S14.

In step S14, immediately, or after a predetermined time (for example thirty minutes or the like) has elapsed, the power of the second electrical load 16 is cut off, and it is set such that a notification operation (for example a message display, lighting of an indicator lamp, sound output, or the like) notifying the fact that the power was cut off is set to execute at the next time that the ignition switch is set to on (IG-ON), the flow proceeds to the end, and the process finishes.

Figure 3:
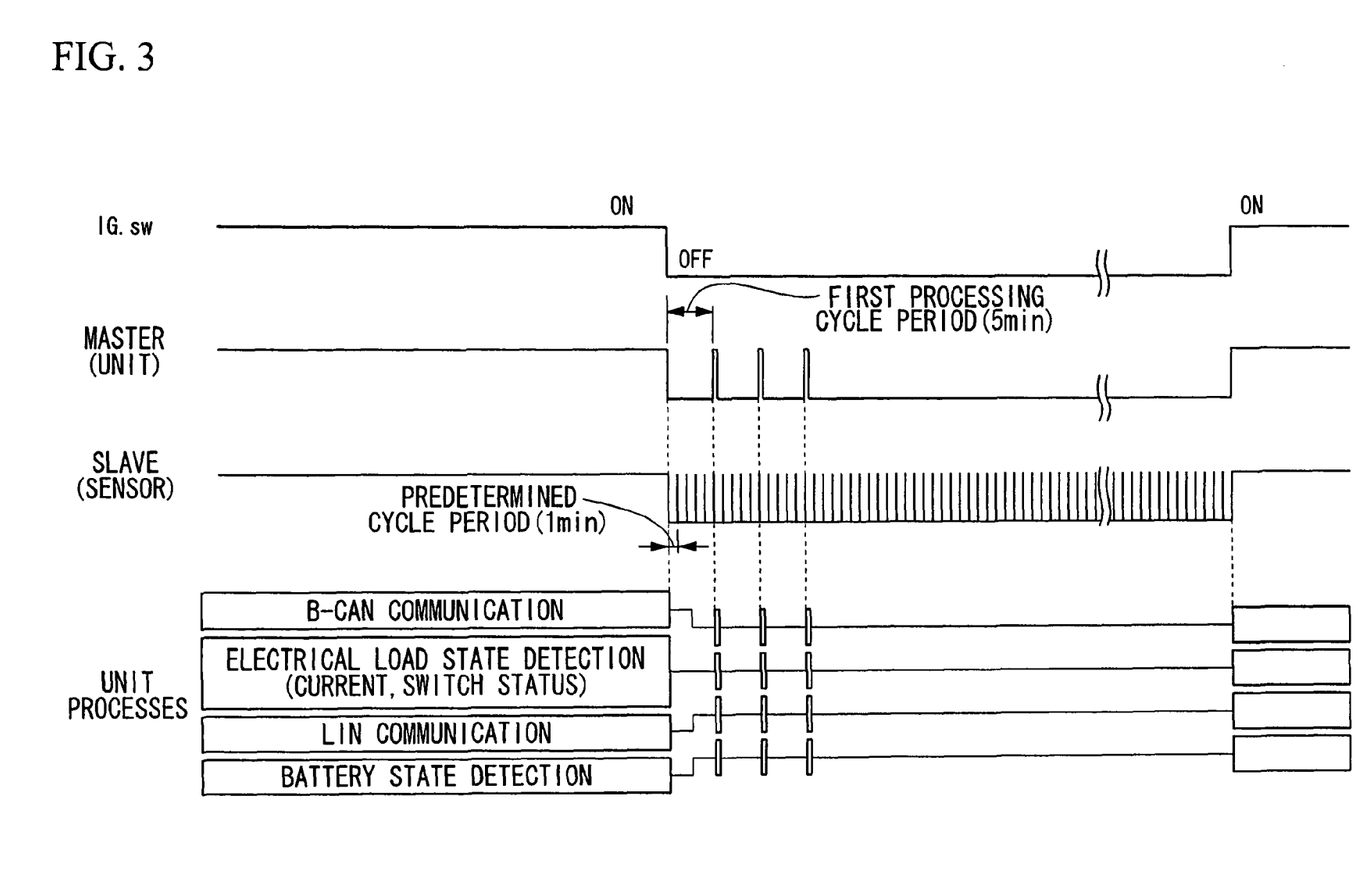
FIG. 3 is a view showing an example of a timing chart of a determination of normality according to the embodiment of the present invention.

In the example of a timing chart of a determination of normality shown in FIG. 3, for example, when the ignition switch (IG. sw) is turned from on to off, continuous communication, in which the CAN communication line 18 and the LIN communication line 19 are in a continuously active state, is stopped in the power management unit 17 containing a power management portion 61, which is a master unit, and the CAN communication line 18 and the LIN communication line 19 are placed in an active state at a predetermined first processing cycle period (for example five minutes or the like). Furthermore, the execution cycle period of the detection operation by the battery sensor 12, which is a slave unit, is extended from the basic processing cycle period (for example 100 ms or the like) to a predetermined cycle period (for example one minute or the like).

Figure 4:
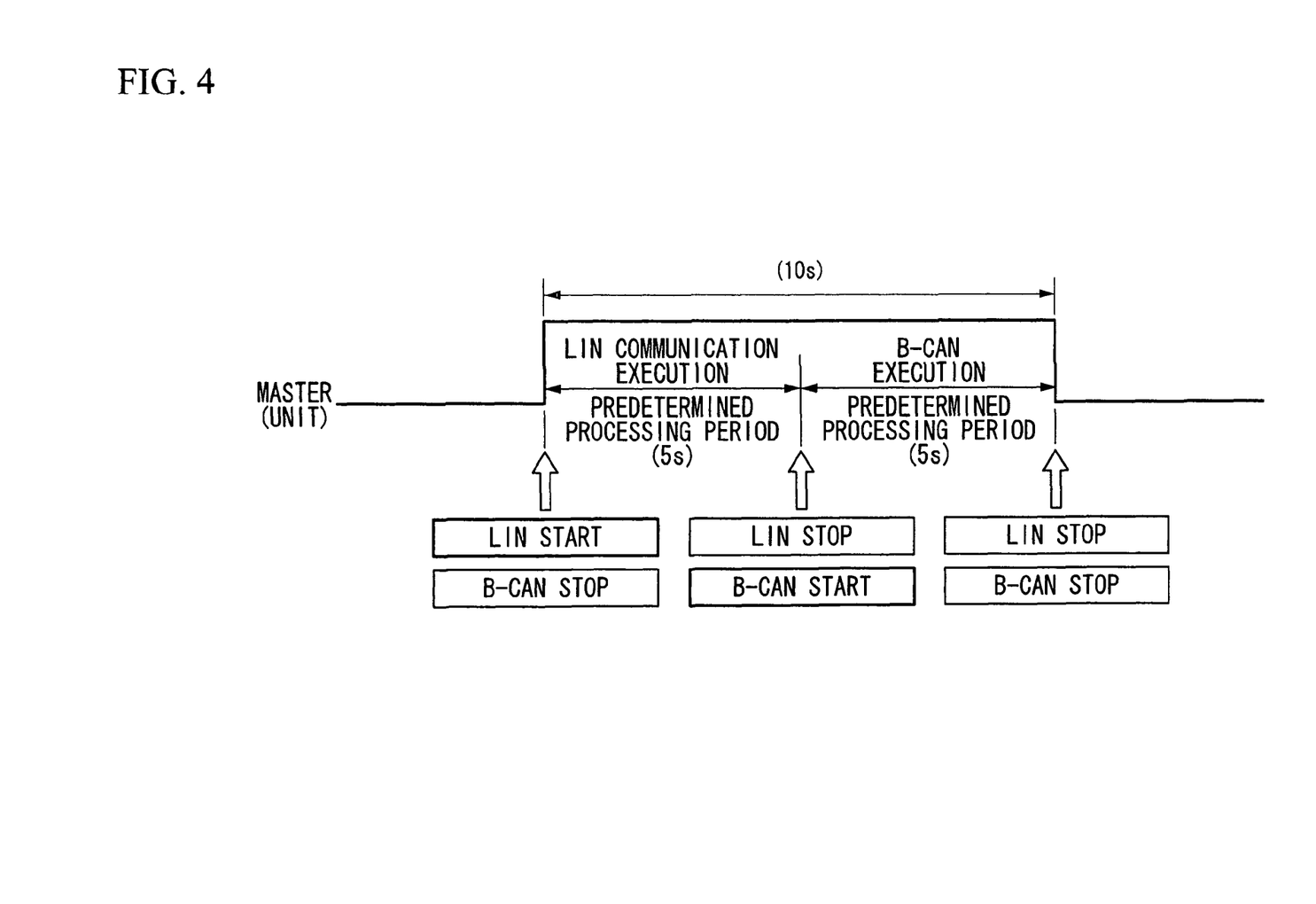
FIG. 4 is a view showing an example of a timing chart of the state of a CAN communication line and a LIN communication line in a first processing cycle period according to the embodiment of the present invention.

In the predetermined first processing cycle period, as shown in FIG. 4 for example, firstly, the CAN communication line 18 is placed in a stopped state (B-CAN stop) for a predetermined processing period (for example five seconds), only the LIN communication line 19 is started (LIN start) in an active state, and detection results such as the consumption amount (for example the battery current IB) of the battery, the consumption state (for example the state of charge SOC) of the battery, and the like, are transmitted from the battery sensor 12 depending on demand instructions output from the power management unit 17 (Unit).

Next, the LIN communication line 19 is placed in a stopped state (LIN stop) for a predetermined processing period (for example five seconds), only the CAN communication line 18 is started (B-CAN start) in an active state, and information about the operation conditions, information about the switching status indicating running state or stopped state, and the like, are transmitted for every electrical load of the first electrical load 15 from a MICU (Multiplex Integrated Control Unit) 33 connected to the CAN communication line 18, for example, depending on demand instructions output from the power management unit 17 (Unit). Then, at the point of time that the predetermined processing period has elapsed, the state, in which the LIN communication line 19 is stopped (LIN stopped), is maintained, and the CAN communication line 18, which was started in an active state, is placed in a stopped state (B-CAN stopped).

In the predetermined first processing cycle period, the processes (Unit processes) executed by the power management unit 17 includes, as shown in FIG. 3 for example, the start of the CAN communication line 18 (B-CAN communication), and the acquisition of information about the operation conditions, information about the switching status indicating running state or stopped state, and the like, for every electrical load of the first electrical load 15 (electrical load state detection (current, switch status)), the start of the LIN communication line 19 (LIN communication), and the acquisition (battery state detection) of the consumption amount of the battery 11 (for example the battery current IB and the like) and the consumption state (for example the state of charge SOC and the like) of the battery 11. The execution of the Unit processes is stopped from the point of time that the battery current IB drops to the second predetermined value or below, before a Miss-use determination time (for example twenty five minutes) has elapsed and a determination of normality is performed (for example after fifteen minutes from when the ignition switch (IG. sw) was turned off, as shown in FIG. 3).

Subsequently, the processing of a long term neglect determination, which is described later, is performed.

Figure 5:
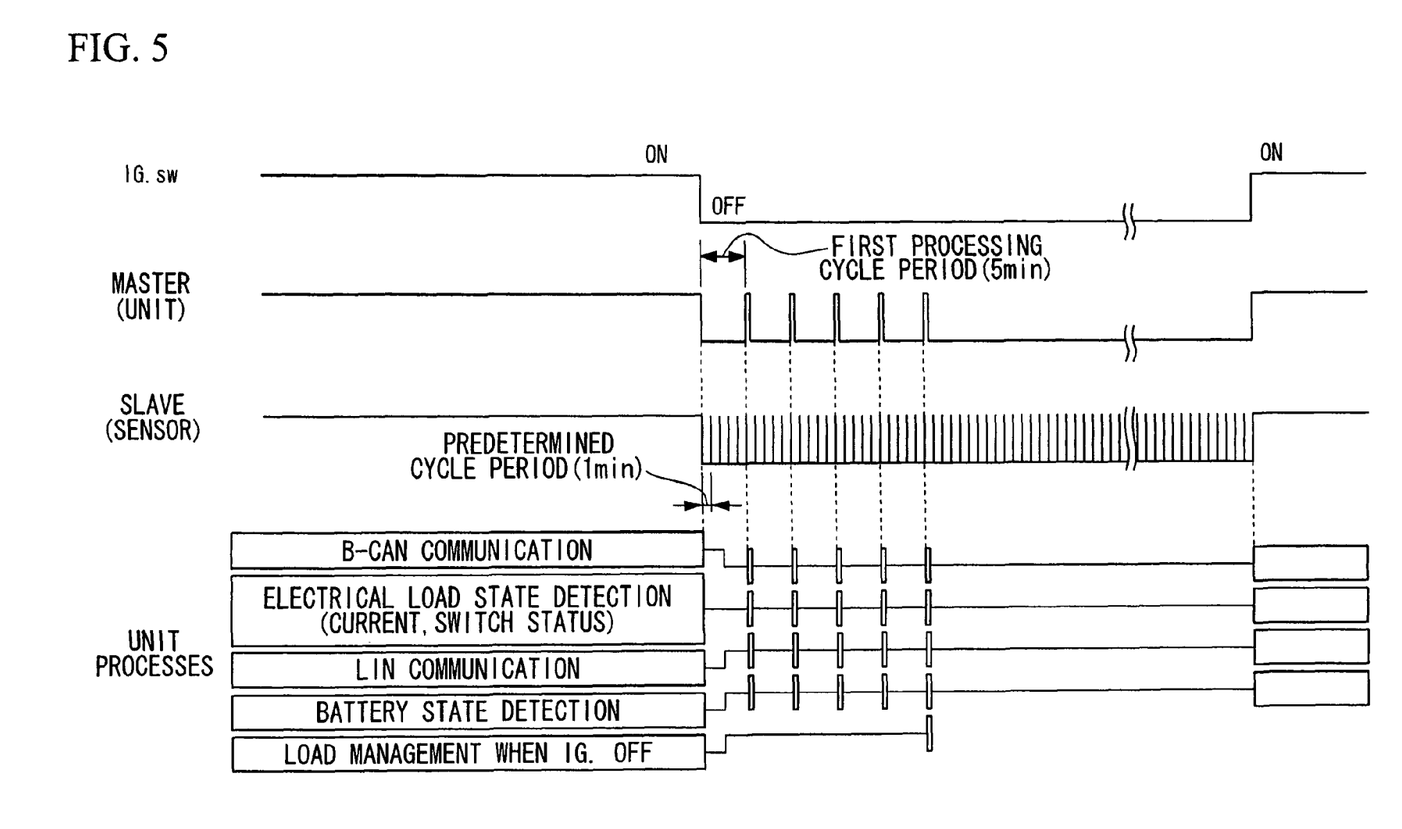
FIG. 5 is a view showing an example of a timing chart of Miss-use determination according to the embodiment of the present invention.

Moreover, in an example of a timing chart of Miss-use determination as shown in FIG. 5, the processes (Unit processes), that are performed by the power management unit 17 at a predetermined first processing cycle period, have been repeated for the period of the Miss-use determination time, and the power to the first electrical load 15 is cut off (load management when IG. OFF) after the Miss-use determination time has elapsed (for example after twenty-five minutes from when the ignition switch (IG. sw) was turned off, as shown in FIG. 5). The execution of the Unit processes is stopped after the power to the first electrical load 15 has been cut off.

Subsequently, in the case where the battery current IB drops to the third predetermined value or below, the processing of the long term neglect determination, which is described later, is performed. On the other hand, in the case where the battery current IB is greater than the third predetermined value, the power to the second electrical load 16 is cut off.

Figure 6:
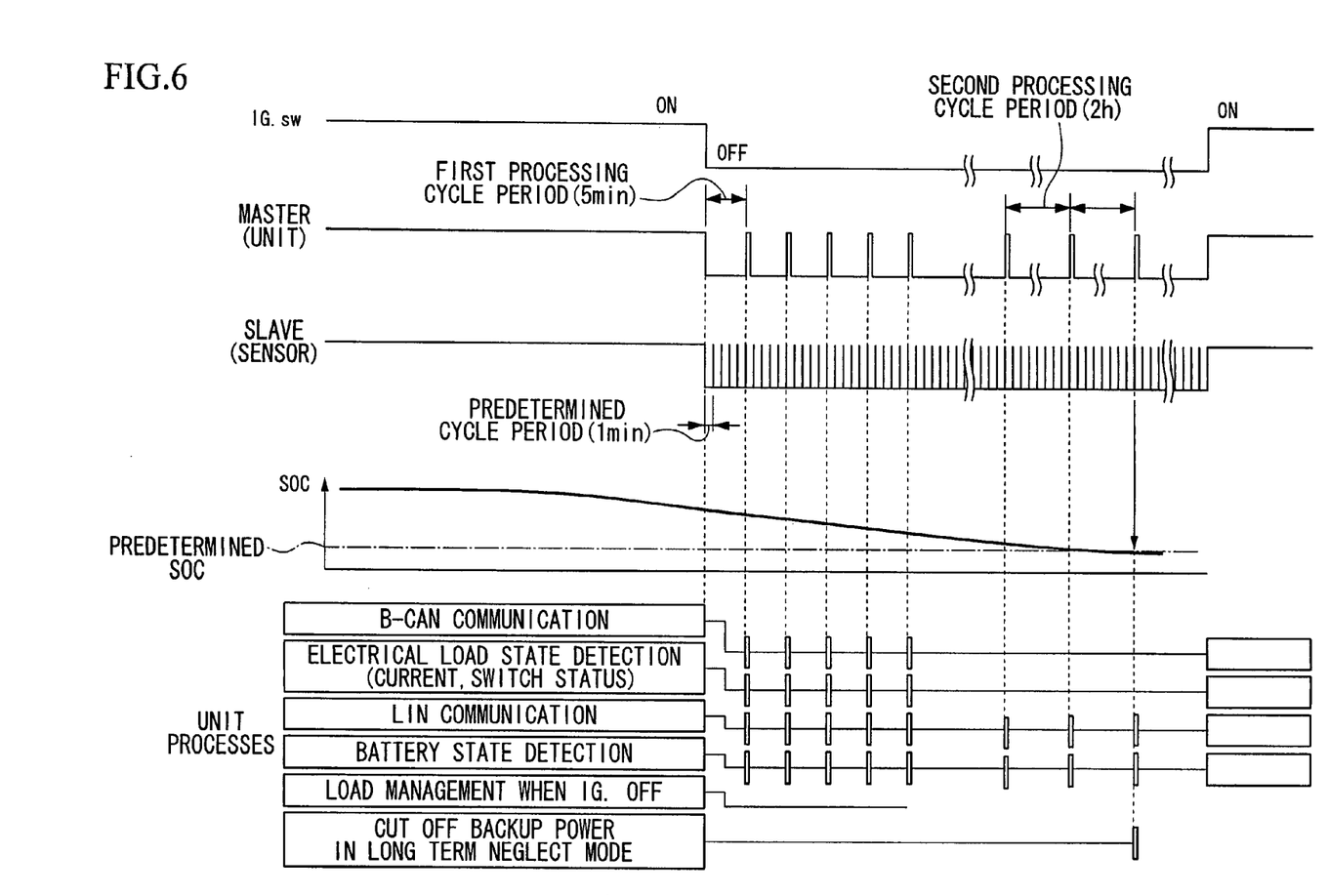
FIG. 6 is a view showing an example of a timing chart of long term neglect determination according to the embodiment of the present invention.

Furthermore, in an example of a timing chart of the long term neglect determination as shown in FIG. 6, the processes (Unit processes) that is performed by the power management unit 17 at a predetermined first processing cycle period has been repeated for the period of the Miss-use determination time, and the power to the first electrical load 15 is cut off after the Miss-use determination time has elapsed. After that the execution of the Unit processes is stopped from the point of time (for example after twenty-five minutes from when the ignition switch (IG. sw) was turned off, as shown in FIG. 6) that the battery current IB drops to the third predetermined value or below.

Then, only the LIN communication line 19 is placed in an active state in the predetermined second process cycle period (for example two hours or the like), and the processes including the start of the LIN communication line 19 (LIN communication), and the acquisition (battery state detection) of the consumption amount of the battery 11 (for example the battery current IB and the like) and the consumption state (for example the state of charge SOC and the like) are repeated for the period of a predetermined long term neglect determination time (for example several days or the like) or for a period until the state of charge SOC of the battery 11 drops to the predetermined SOC or below. Then, execution of the later processes is stopped and the power to the second electrical load 16 is cut off (cut off backup power in long term neglect mode) at the point of time that the predetermined long term neglect determination time (for example several days) has elapsed, or at the point of time that the state of charge SOC of the battery 11 drops to the predetermined SOC or below.

As described above, according to a vehicle load control device 10 of the present embodiment, since the time interval for detecting the consumption state of the battery 11 (for example the battery current IB, the battery voltage VB, the state of charge SOC, and the like) is changed depending on the consumption amount (for example battery current IB and the like) of the battery 11 when the ignition switch is off, it is possible to detect the consumption state of the battery 11 while ensuring a desired detection accuracy, with the necessary minimum detection interval, depending on the state of the working conditions of the electrical load when the ignition switch is turned off, so that it is possible to prevent the power consumption of the detection operation itself from increasing.

Moreover, in the case where the consumption amount of the battery 11 after the ignition switch is turned off is greater than or equal to a predetermined value, and the occurrence of Miss-use is established, it is determined that there is a high probability that the operator has forgotten to turn off the power supply to the first electrical load 15, so the power supply to the first electrical load 15 is cut off. Thus, there is a high probability that the consumption amount of the battery 11 can be improved with no need for direct detection of the first electrical load 15 in operation state, so that it is possible to reduce the consumption amount of the battery 11 efficiently while preventing the cost from increasing.

Furthermore, in the process of Miss-use determination, by detecting the occurrence of Miss-use based on a Miss-use determination time, which changes depending on the consumption state of the battery 11 and the state of charge SOC of the battery 11, and cutting off the power to the first electrical load 15, it is possible to prevent the power from being consumed unnecessarily in a state in which there is a high probability that the operator has forgotten to turn off the power supply to the first electrical load 15. So that compared with the case where the power supply to the electrical load 15 is cut off routinely depending only on the consumption state of the battery 11, for example, it is possible to prevent the battery 11 from deteriorating even more.

Moreover, in the case where the consumption amount of the battery 11 is less than or equal to a predetermined value, and is improved by cutting the power off to the first electrical load 15, by performing the processing of the long term neglect determination, it is possible to determine whether or not to continue to supply power to the second electrical load 16 that requires power consumption which is a relatively low consumption amount. As a result, detailed controls are possible, such as; cutting off the power supply to the first electrical load 15, such as an interior light that is on because the operator forgot to turn it off for example, and maintaining the power supply to the second electrical load 16 of a backup system, or the like. So that it is possible to improve the convenience while controlling the increase in the power consumption of the battery 11.

Furthermore, in the case where the consumption amount of the battery 11 does not drop to a predetermined value or below, and does not improve even if the power to the first electrical load 15 is cut off, it is determined that there is a high probability that the second electrical load 16 is in an abnormal state, so it is possible to prevent unnecessary power consumption by cutting off the power supply to the second electrical load 16.

In the above-described present embodiment, the Miss-use determination time is shorter than the second processing cycle period.

Moreover, according to the above-described present embodiment, even in the case where the power supply to the first electrical load 15 is continued intentionally by the operator, the operation of the first electrical load 15 can be allowed within acceptable range depending on the state of charge SOC of the battery 11 and the like, so that it is possible to improve the convenience while preventing the battery 11 from deteriorating.

In the above-described present embodiment, the first processing cycle period and the second processing cycle period are fixed values. However, they are not limited to these, and they may be, for example, variable values that change depending on the consumption state of the battery 11 (for example battery current IB, battery voltage VB, the state of charge SOC, and the like), which are detected by the battery sensor 12.

As a result, even in a state in which each of the processes is repeated in the first processing cycle period within the Miss-use determination time, it is possible to change the cycle period (first processing cycle period) in which each of the processes is carried out on the next occasion depending on the signal of the detection result output from the battery sensor 12. Similarly, when the processing of the long term neglect determination is carried out, it is possible to change the second processing cycle period depending on the signal of the detection result output from the battery sensor 12.

As a result, it is possible to detect the consumption state of the battery 11 at appropriate intervals as required depending on the consumption state of the battery 11, so that it is possible to prevent excessive power from being consumed in order to detect the consumption state of the battery 11.

In the above-described present embodiment, a range of determination processing on the consumption amount of the battery 11 is carried out based on the battery current IB obtained from the battery sensor 12. However, it is not limited to this, and a range of determination processing on the consumption amount of the battery 11 may be carried out based on the battery voltage VB obtained from the battery sensor 12, for example. In addition, the battery sensor 12 can detect at least one of the state of charge SOC, the battery current IB, and the battery voltage VB as the consumption state of the battery. Also, the battery sensor 12 can detect any combination of the state of charge SOC, the battery current IB, and the battery voltage VB as the consumption state of the battery.

In the above-described present embodiment, the vehicle load control device 10 may include sensors for detecting the temperature of the battery 11, the internal resistance of the battery 11, and the like, and the consumption amount and the consumption state of the battery 11 are corrected depending on the detection signals output from each of the sensors to carry out a range of determination processing. In this case, it is possible to improve the determination accuracy.

While embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A vehicle load control device comprising:
a battery that supplies power to an electrical load of the vehicle;
a battery sensor that detects a consumption state of the battery;
a control unit that cuts off power supply to the electrical load when the consumption state of the battery reaches a predetermined state; and
a timer;
wherein:
the electrical load includes a first electrical load to which power supply and cut off under the control of an operator are possible, and a second electrical load to which power supply and cut off under the control of the operator are prohibited;
the control unit performs a first control for detecting a consumption state of the battery at a relatively short first time interval, in a case where a consumption amount of the battery after an engine stops is greater than or equal to a predetermined value;
the timer is operable to measure a duration of the first control, and regardless of the consumption state of the battery, the control unit cuts off the power supply to the first electrical load and ends the first control when the measured duration reaches a predetermined time;
the control unit performs a second control for detecting a consumption state of the battery at a relatively long second time interval, in a case where the consumption amount of the battery after the engine stops is less than the predetermined value, the control unit operable to cut off the power supply to the second electrical load in the second control; and
the control unit cuts off power supply to the electrical load depending on the consumption state of the battery detected by the battery sensor.

2. The vehicle load control device according to claim 1, wherein the control unit performs the second control after the power supply to the first electrical load is cut off by the first control, and cuts off the power supply to the second electrical load in a case where the consumption amount of the battery is greater than or equal to a predetermined value.

3. The vehicle load control device according to claim 2, wherein the predetermined time is shorter than the second time interval.

4. The vehicle load control device according to claim 1, wherein:
when the consumption amount of the battery after the power supply to the first electrical load is cut off by the first control is less than a third predetermined value, the control unit performs the second control, and
when the consumption amount of the battery after the power supply to the first electrical load is cut off by the first control is greater than or equal to the third predetermined value, the control unit cuts off the power supply to the second electrical load without performing the second control.

5. The vehicle load control device according to claim 1, wherein the predetermined time is set depending on the consumption state of the battery.

6. The vehicle load control device according to claim 1, wherein the predetermined time is shorter than the second time interval.

7. The vehicle load control device according to claim 1, wherein when the consumption amount of the battery is less than or equal to a second predetermined value when the first control is performed, the control unit ends the first control and performs the second control even before the predetermined time is elapsed.

8. A vehicle load control device comprising:
a battery that supplies power to an electrical load of the vehicle;
a battery sensor that detects a consumption state of the battery after an engine stops;
a timer; and
a control unit that cuts off the power supply to the electrical load when the consumption state of the battery reaches a predetermined state,
wherein:
the electrical load includes a first electrical load to which power supply and cut off under the control of an operator are possible, and a second electrical load to which power supply and cut off under the control of the operator are prohibited;
the control unit performs a first control for detecting a consumption state of the battery at a relatively short first time interval, in a case where a consumption amount of the battery after an engine stops is greater than or equal to a predetermined value, the timer operable to measure a duration of the first control;
regardless of the consumption state of the battery, the control unit cuts off a power supply to a first electrical load and ends the first control when the measured duration reaches a predetermined time; and
the control unit sets a time interval to a next detection of the battery sensor depending on a consumption state of the battery when detection of the consumption state of the battery is executed by the battery sensor.

9. A vehicle load control device comprising:
a battery that supplies power to an electrical load of the vehicle;
a battery sensor that detects a consumption state of the battery; and
a control unit that cuts off power supply to the electrical load when the consumption state of the battery reaches a predetermined state,
wherein the control unit performs a first control for detecting a consumption state of the battery at a relatively short first time interval, in a case where a consumption amount of the battery after an engine stops is greater than or equal to a predetermined value;
the control unit performs a second control for detecting a consumption state of the battery at a relatively long second time interval, in a case where the consumption amount of the battery after the engine stops is less than the predetermined value;
the control unit cuts off power supply to the electrical load depending on the consumption state of the battery detected by the battery sensor;
the electrical load includes a first electrical load and a second electrical load, and the consumption amount of the second electrical load is smaller than that of the first electrical load;
the power supply to the first electrical load is cut off in the first control, and the power supply to the second electrical load is cut off in the second control; and
detection of the consumption state of the battery is continued in the second control that is performed after the first control.

10. The vehicle load control device according to claim 9, wherein after the power of the second electrical load is cut off, the first and the second controls stop.

11. The vehicle load control device according to claim 9, further comprising a timer for measuring a duration of the first control, wherein regardless of the consumption state of the battery, the control unit cuts off the power supply to the first electrical load and ends the first control when the measured duration of the timer reaches a predetermined time.

12. The vehicle load control device according to claim 10, wherein the control unit performs the second control after the power supply to the first electrical load is cut off by the first control, and cuts off the power supply to the second electrical load in a case where the consumption amount of the battery is greater than or equal to a predetermined value.

13. The vehicle load control device according to claim 11, wherein:
when the consumption amount of the battery after the power supply to the first electrical load is cut off by the first control is less than a third predetermined value, the control unit performs the second control, and
when the consumption amount of the battery, after the power supply to the first electrical load is cut off by the first control, is greater than or equal to the third predetermined value, the control unit cuts off the power supply to the second electrical load without performing the second control.

14. The vehicle load control device according to claim 11, wherein the predetermined time is set depending on the consumption state of the battery.

15. The vehicle load control device according to claim 11, wherein the predetermined time is shorter than the second time interval.

16. The vehicle load control device according to claim 12, wherein the predetermined time is shorter than the second time interval.

17. The vehicle load control device according to claim 11, wherein when the consumption amount of the battery is less than or equal to a second predetermined value when the first control is performed, the control unit ends the first control and performs the second control even before the predetermined time is elapsed.

* * * * *